United States Patent
Brinkhof et al.

(10) Patent No.: US 10,416,577 B2
(45) Date of Patent: Sep. 17, 2019

(54) POSITION MEASURING METHOD OF AN ALIGNMENT TARGET

(71) Applicants: ASML NETHERLANDS B.V., Veldhoven (NL); ASML HOLDING N.V., Veldhoven (NL)

(72) Inventors: Ralph Brinkhof, Vught (NL); Simon Gijsbert Josephus Mathijssen, Rosmalen (NL); Maikel Robert Goosen, Eindhoven (NL); Vassili Demergis, Norwalk, CT (US); Bartolomeus Petrus Rijpers, Nuenen (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/777,162

(22) PCT Filed: Nov. 29, 2016

(86) PCT No.: PCT/EP2016/079143
§ 371 (c)(1),
(2) Date: May 17, 2018

(87) PCT Pub. No.: WO2017/093256
PCT Pub. Date: Jun. 8, 2017

(65) Prior Publication Data
US 2018/0329307 A1 Nov. 15, 2018

Related U.S. Application Data

(60) Provisional application No. 62/262,780, filed on Dec. 3, 2015.

(51) Int. Cl.
*G03F 7/20* (2006.01)
*G03F 9/00* (2006.01)

(52) U.S. Cl.
CPC .......... *G03F 9/7046* (2013.01); *G03F 9/7076* (2013.01); *G03F 9/7088* (2013.01); *G03F 9/7092* (2013.01); *G03F 7/70141* (2013.01)

(58) Field of Classification Search
CPC ..... G03F 9/7046; G03F 9/7076; G03F 9/7088
See application file for complete search history.

(56) References Cited

U.S. PATENT DOCUMENTS 5,468,580 A * 11/1995 Tanaka ................ G03F 7/70633
355/53
6,961,116 B2 11/2005 Den Boef et al.
(Continued)

FOREIGN PATENT DOCUMENTS

WO 2014/146906 9/2014
WO 2015/062854 5/2015

OTHER PUBLICATIONS

International Search Report and Written Opinion dated Feb. 22, 2017 in corresponding International Patent Application No. PCT/EP2016/079143.
(Continued)

*Primary Examiner* — Michelle M Iacoletti
(74) *Attorney, Agent, or Firm* — Pillsbury Winthrop Shaw Pittman LLP

(57) ABSTRACT

A method of measuring a position of an alignment target on a substrate using an optical system. The method includes measuring a sub-segmented target by illuminating the sub-segmented target with radiation and detecting radiation diffracted by the sub-segmented target using a detector system to obtain signals containing positional information of the one sub-segmented target. The sub-segmented target has structures arranged periodically in at least a first direction, at least some of the structures including smaller sub-structures, and each sub-segmented target is formed with a positional offset between the structures and the sub-structures that is a (Continued)

combination of both known and unknown components. The signals, together with information on differences between known offsets of the sub-segmented target are used to calculate a measured position of an alignment target which is corrected for the unknown component of the positional offset.

20 Claims, 7 Drawing Sheets

(56) References Cited

U.S. PATENT DOCUMENTS

| | | |
|---|---|---|
| 8,208,121 B2 | 6/2012 | Bijnen et al. |
| 8,593,646 B2 | 11/2013 | Den Boef et al. |
| 8,705,007 B2 | 4/2014 | Cramer et al. |
| 2003/0021467 A1 | 1/2003 | Adel et al. |
| 2009/0195768 A1 | 8/2009 | Bijnen et al. |
| 2010/0201963 A1 | 8/2010 | Cramer et al. |
| 2012/0212749 A1 | 8/2012 | Den Boef et al. |

OTHER PUBLICATIONS

Huijbregtse, Jeroen, et al., "Overlay Performance with Advanced ATHENA™ Alignment Strategies", Proceedings of SPIE, vol. 5038, pp. 918-928 (2003).

* cited by examiner

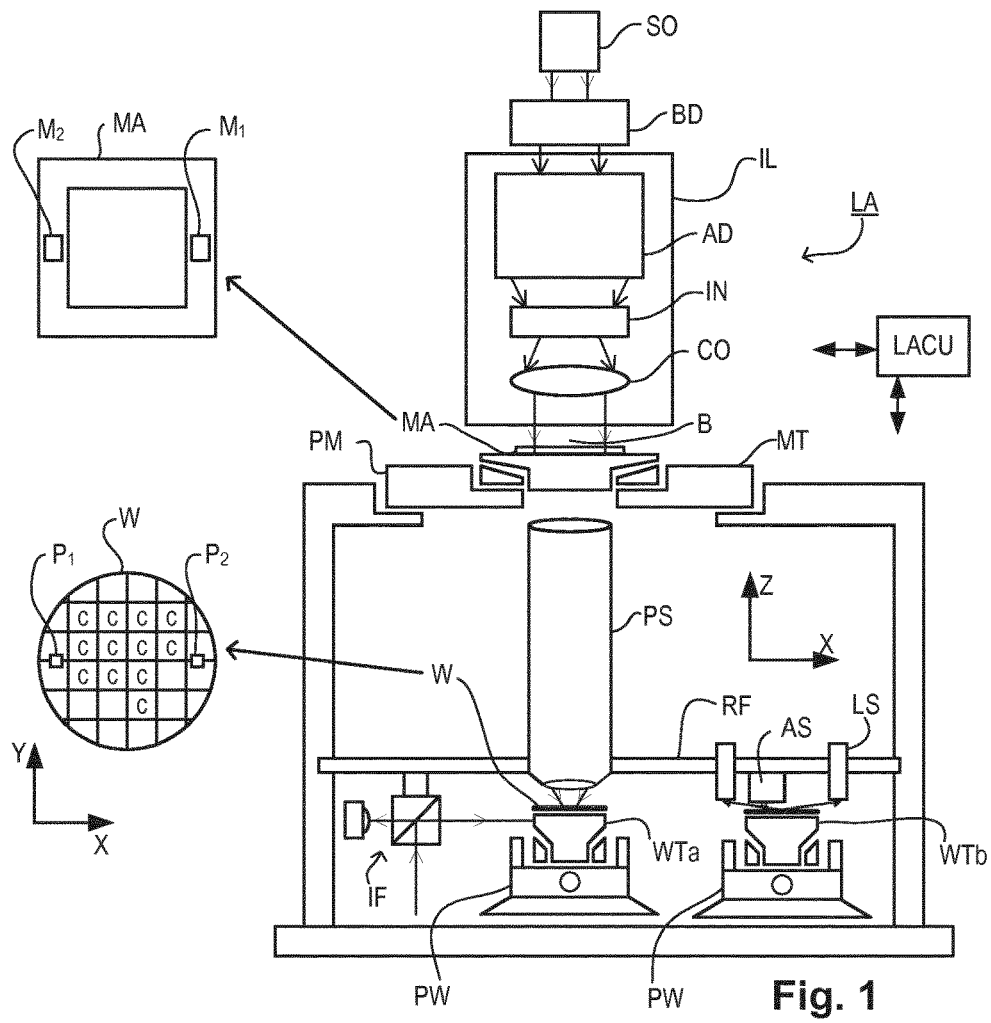
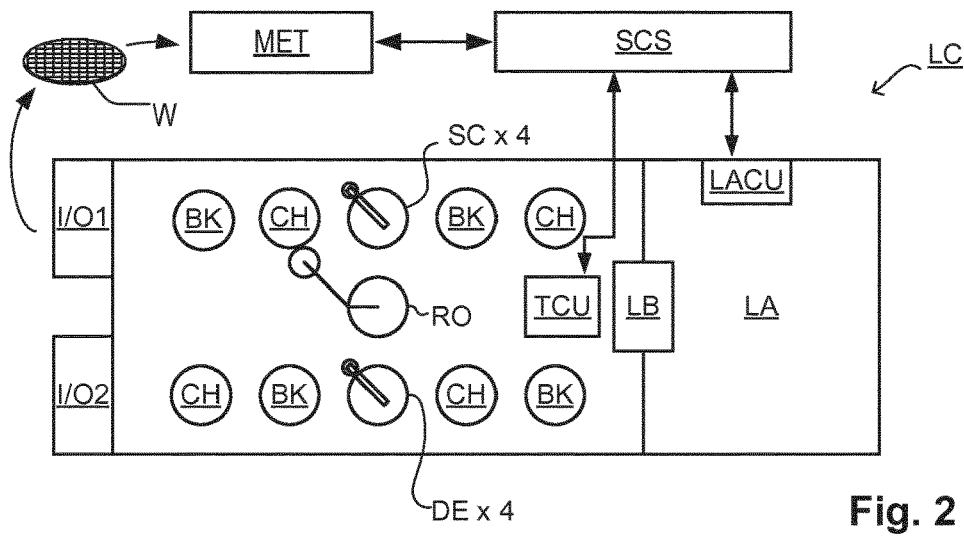
Fig. 1
Fig. 2

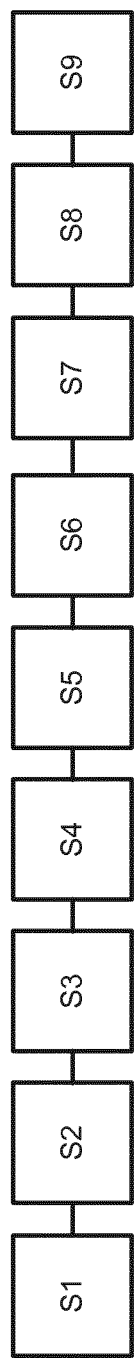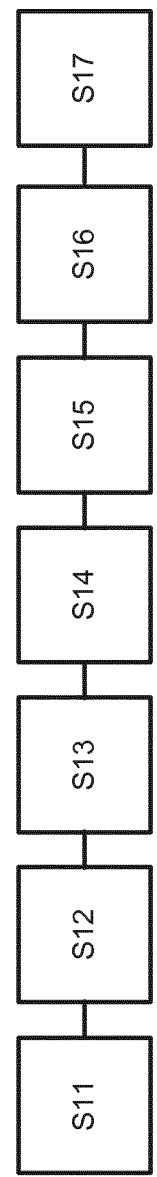
Fig. 9
Fig. 10

POSITION MEASURING METHOD OF AN ALIGNMENT TARGET

CROSS-REFERENCE TO RELATED APPLICATIONS

This application is the U.S. national phase entry of PCT patent application no. PCT/EP2016/079143, which was filed on Nov. 29, 2016, which claims the benefit of priority of U.S. Provisional Patent Application No. 62/262,780, which was filed on Dec. 3, 2015, and which is incorporated herein in its entirety by reference.

FIELD

The present invention relates to a method for measuring the position of at least one alignment target on a substrate. The invention in other aspects provides a lithographic apparatus, a lithographic cell and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, alignment targets are generally provided on the substrate, and the lithographic apparatus includes one or more alignment sensors by which positions of targets on a substrate can be measured accurately. These alignment sensors are effectively position measuring apparatuses. Different types of targets and different types of alignment sensors are known from different times and different manufacturers. A type of sensor widely used in current lithographic apparatus is based on a self-referencing interferometer as described in U.S. Pat. No. 6,961,116 (den Boef et al). Generally targets are measured separately to obtain X- and Y-positions. However, combined X- and Y-measurement can be performed using the techniques described in published patent application US 2009/195768 A (Bijnen et al). The contents of both of these applications are incorporated herein by reference.

Advanced alignment techniques using a commercial alignment sensor are described by Jeroen Huijbregtse et al in "Overlay Performance with Advanced ATHENA™ Alignment Strategies", Metrology, Inspection, and Process Control for Microlithography XVII, Daniel J. Herr, Editor, Proceedings of SPIE Vol. 5038 (2003). These strategies can be extended and applied commercially in sensors of the type described by US'116 and US'768, mentioned above. A feature of the commercial sensors is that they measure positions using several wavelengths (colors) and polarizations of radiation (light) on the same target grating or gratings. No single color is ideal for measuring in all situations, so the commercial system selects from a number of signals, which one provides the most reliable position information. Alternatively the system can also use a linear combination of signals from different colors and/or polarizations, as described in a patent application comprising the present applicant's internal file number 2014D00195, which is herein incorporated by reference.

There is continually a need to provide more accurate position measurements, especially to control the overlay error as product features get smaller and smaller. One cause of error in alignment is as a result of the alignment target being exposed with a different shift to nominal than the surrounding product features, due to the large difference in pitch between the alignment target and product features. To explain, alignment targets are generally formed of gratings with features far larger than the features of the device pattern which is to be applied to the substrate in the lithographic apparatus. The required positioning accuracy is therefore obtained not by the fineness of the alignment grating, but rather by the fact that it provides a periodic signal that can be measured over many periods, to obtain overall a very accurate position measurement. On the other hand, a coarse grating is not representative of the actual product features, and therefore its formation is subject to different processing effects than the real product features.

The alignment targets are typically applied to the substrate throughout a device manufacturing process, using a lithographic apparatus similar or even identical to the one which will apply the patterns for subsequent product layers. The product features become subject to slightly different errors in their positioning than the coarser alignment grating features, for example due to aberrations in an optical projection system used to apply the pattern. The effect of this in current alignment sensors is that the measured position contains unknown errors, being neither the position of the coarse grating nor that of the product features.

To address this error mismatch between coarser alignment grating features and product features (referred to herein as "mark print error"), an alignment target has been developed which allows the mark print error to be measured, and therefore corrected for. Such alignment targets may be referred to as differential sub-segmented targets (DSM targets) and are described in WO2014/014906 which is herein incorporated by reference. While such DSM targets are effective for measuring the mark print error, their effectiveness has been found to be compromised by some substrate processing steps. These processing steps, of which one is etching, can cause asymmetrical deformation of the target which degrades performance of the target. This limits their usefulness in normal substrate alignment sequences, as the targets are typically measured subsequent to this processing.

SUMMARY

It would be desirable to address the abovementioned issue relating to processing of sub-segmented targets.

The invention in a first aspect comprises a method of measuring positions of at least one alignment target on a substrate using an optical system, the method comprising:

(a) measuring at least one sub-segmented target by illuminating said sub-segmented target with radiation and detecting radiation diffracted by said sub-segmented target using one or more detectors to obtain signals containing positional information of the sub-segmented target, this step being performed on the sub-segmented target when said sub-segmented target is still in resist, the sub-segmented target comprising structures arranged periodically in at least a first direction, at least some of said structures comprising smaller sub-structures, each sub-segmented target being formed with a positional offset between the structures and the sub-structures that is a combination of both known and unknown components; and (b) using said signals, together with information on differences between the known offsets of said sub-segmented target, to calculate a measured position of at least one alignment target which is corrected for said unknown component of said positional offset Also disclosed is a method of manufacturing devices wherein a device pattern is applied to a substrate using a lithographic process, the method including positioning the applied pattern by reference to a measured position of at least one alignment target formed on the substrate, the measured position being obtained by a method of the first aspect.

Associated lithographic apparatuses, lithographic cells and computer programs are also disclosed.

BRIEF DESCRIPTION OF THE DRAWINGS

Embodiments of the invention will now be described, by way of example only, with reference to the accompanying schematic drawings in which:

FIG. 1 depicts an exemplary lithographic apparatus including an alignment sensor usable in performing methods according to the present invention;

FIG. 2 depicts a lithographic cell or cluster usable to perform methods according to the present invention;

FIG. 3(a) and FIG. 3(b), illustrates various forms of an alignment target that may be provided on a substrate in the apparatus of FIG. 1;

FIG. 9 is a flowchart of a method of measuring position using a differential sub-segmented target measured by a metrology apparatus according to an embodiment of the invention; and FIG. 10 is a flowchart of a method of measuring position using the differential alignment target of FIG. 7 according to an embodiment of the invention.

DETAILED DESCRIPTION OF EXEMPLARY EMBODIMENTS

Figure 3:
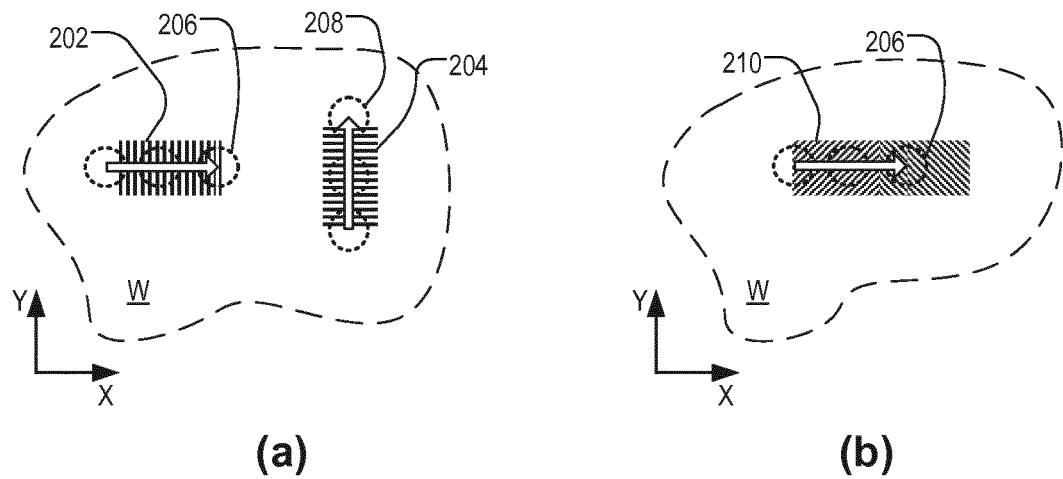
FIG. 3, comprising

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment targets M1, M2 and substrate alignment targets P1, P2. Although the substrate alignment targets as illustrated occupy dedicated target portions, they may be located in spaces between target portions (these are known as scribe-lane alignment targets). Similarly, in situations in which more than one die is provided on the mask MA, the mask alignment targets may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment targets on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

As shown in FIG. 2, the lithographic apparatus LA may form part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The possibility of measuring the developed resist image forms the basis of the embodiments disclosed herein.

FIG. 3(a) shows examples of alignment targets 202, 204, provided on substrate W for the measurement of X-position and Y-position, respectively. Each target in this example comprises a series of bars formed in a product layer or other layer applied to or etched into the substrate. The bars are regularly spaced and act as grating lines so that the target can be regarded as a diffraction grating with a sufficiently well-known spatial period (pitch). The bars on the X-direction target 202 are parallel to the Y-axis to provide periodicity in the X direction, while the bars of the Y-direction target 204 are parallel to the X-axis to provide periodicity in the Y direction. The alignment sensor AS (shown in FIG. 1) scans each target optically with a spot 206 (X direction), 208 (Y direction) of radiation, to obtain a periodically-varying signal, such as a sine wave. The phase of this signal is analyzed, to measure the position of the target, and hence of substrate W, relative to the alignment sensor, which in turn is fixed relative to the reference frame RF of the apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment sensor AS uses a wavelength of radiation (or usually plural wavelengths) much longer than the exposure radiation to be used for applying patterns to the substrate. Fine position information can be obtained, however, because the large number of bars allows the phase of a repeating signal to be accurately measured.

Coarse and fine targets may be provided, so that the alignment sensor can distinguish between different cycles of the periodic signal, as well as the exact position (phase) within a cycle. Targets of different pitches can also be used for this purpose. These techniques are again well known to the person skilled in the art, and will not be detailed herein. The design and operation of such sensors is well known in the art, and each lithographic apparatus may have its own design of sensor. For the purpose of the present description, it will be assumed that the alignment sensor AS is generally of the form described in U.S. Pat. No. 6,961,116 (den Boef et al). FIG. 3(b) shows a modified target for use with a similar alignment system, which X- and Y-positions can be obtained through a single optical scan with the illumination spot 206 or 208. The target 210 has bars arranged at 45 degrees to both the X- and Y-axes. This combined X- and Y-measurement can be performed using the techniques described in published patent application US 2009/195768 A (Bijnen et al), the contents of which are incorporated herein by reference.

Figure 4:
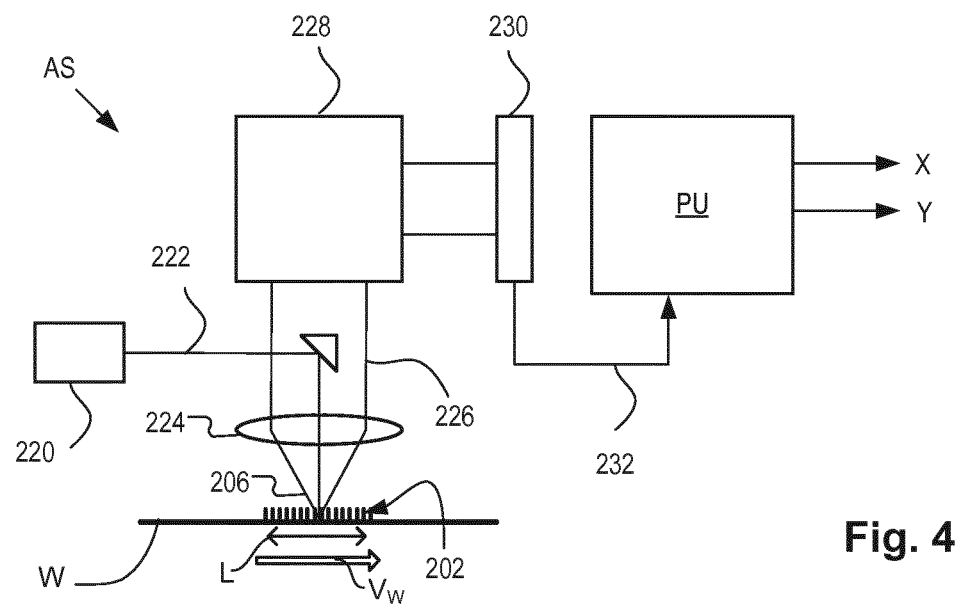
FIG. 4 is a schematic block diagram of a known alignment sensor scanning an alignment target in the apparatus of FIG. 1.

FIG. 4 is a schematic block diagram of a known alignment sensor AS. Illumination source 220 provides a beam 222 of radiation of one or more wavelengths, which is diverted by a spot mirror 223 through an objective lens 224 onto a target, such as target 202, located on substrate W. As indicated schematically in FIG. 3, in the example of the present alignment sensor based on U.S. Pat. No. 6,961,116, mentioned above, the illumination spot 206 by which the target 202 is illuminated may be slightly smaller in diameter then the width of the target itself.

Radiation scattered by target 202 is picked up by objective lens 224 and collimated into an information-carrying beam 226. A self-referencing interferometer 228 is of the type disclosed in US'116, mentioned above and processes beam 226 and outputs separate beams (for each wavelength) onto a sensor array 230. Spot mirror 223 serves conveniently as a zero order stop at this point, so that the information carrying beam 226 comprises only higher order diffracted radiation from the target 202 (this is not essential to the measurement, but improves signal to noise ratios). Intensity signals 232 from individual sensors in sensor grid 230 are provided to a processing unit PU. By a combination of the optical processing in the block 228 and the computational processing in the unit PU, values for X- and Y-position on the substrate relative to the reference frame RF are output. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

As mentioned already, a single measurement of the type illustrated only fixes the position of the target within a certain range corresponding to one pitch of the target. Coarser measurement techniques are used in conjunction with this to identify which period of the sine wave is the one containing the targeted position. The same process at coarser and/or finer levels can be repeated at different wavelengths for increased accuracy, and for robust detection of the target irrespective of the materials from which the target is made, and on and/or below which it sits. The wavelengths can be multiplexed and demultiplexed optically so as to be processed simultaneously, and/or they may be multiplexed by time division or frequency division. Examples in the present disclosure will exploit measurement at several wavelengths to provide a practical and robust measurement apparatus (alignment sensor) with reduced sensitivity to target asymmetry.

Referring to the measurement process in more detail, an arrow labeled $v_W$ in FIG. 4 illustrates a scanning velocity with which spot 206 traverses the length L of target 202. In this example, the alignment sensor AS and spot 206 in reality remain stationary, while it is the substrate W that moves with velocity $v_W$. The alignment sensor can thus be mounted rigidly and accurately to the reference frame RF (FIG. 1), while effectively scanning the target 202 in a direction opposite to the direction of movement of substrate W. The substrate is controlled in this movement by its mounting on the substrate table WT and the substrate positioning system PW. All movements shown are parallel to the X axis. Similar actions apply for scanning the target 204 with spot 208 in the Y direction. This will not be described further.

As discussed in the published patent application US 2012/0212749 A1, the high productivity requirements required of the lithographic apparatus require the measurement of the alignment targets at numerous positions on the substrate to be performed as quickly as possible, which implies that the scanning velocity $v_W$ is fast, and the time $T_{ACQ}$ available for acquisition of each target position is correspondingly short. In simplistic terms, the formula $T_{ACQ}=L/v_W$ applies. The prior application US 2012/0212749 A1 describes a technique to impart an opposite scanning motion of the spot, so as to lengthen the acquisition time. The same scanning spot techniques can be applied in sensors and methods of the type newly disclosed herein, if desired.

A metrology apparatus suitable for use in embodiments of the invention is shown in FIG. 5(a). A target T and diffracted rays of measurement radiation used to illuminate the target are illustrated in more detail in FIG. 5(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 5(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line+1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 5(a) and 4(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 5(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

Figure 5:
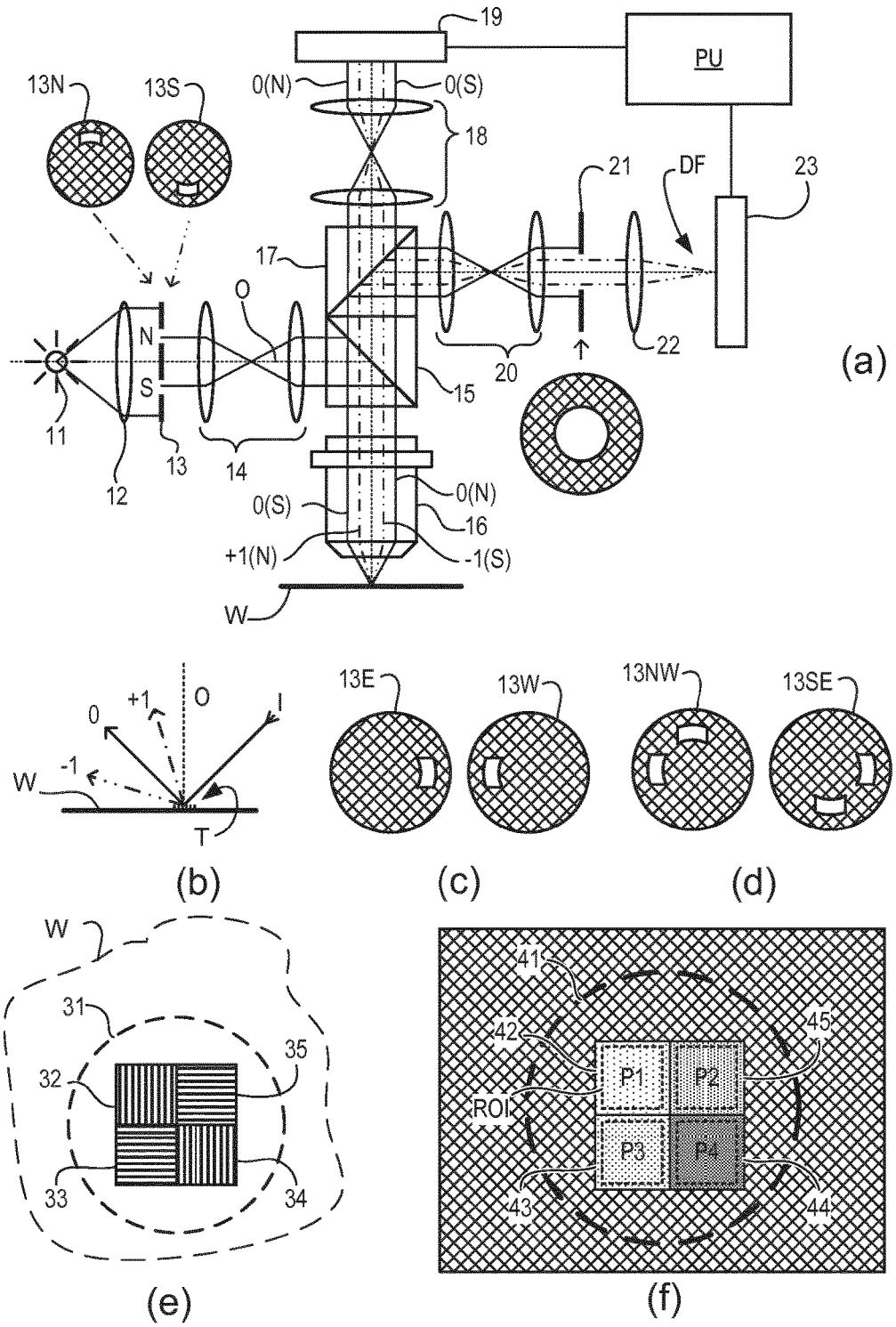
FIG. 5 comprises (a) a schematic diagram of a dark field scatterometer for use in measuring targets according to embodiments of the invention using a first pair of illumination apertures, (b) a detail of diffraction spectrum of a target grating for a given direction of illumination (c) a second pair of illumination apertures providing further illumination modes in using the scatterometer for diffraction based overlay measurements (d) a third pair of illumination apertures combining the first and second pair of apertures; (e) a known form of multiple grating target and an outline of a measurement spot on a substrate; and (f) an image of the target of FIG. 5(e) obtained in the scatterometer of FIG. 5(a)

The particular forms of aperture plate 13 and field stop 21 shown in FIG. 5 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 5) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 4(c) and (d). The use of these, and numerous other variations and applications of the apparatus are described in prior published applications, mentioned above.

FIG. 5(e) depicts a (composite) target formed on a substrate according to known practice. The target in this example comprises four gratings 32 to 35 positioned closely together so that they will all be within a measurement spot 31 formed by the metrology radiation illumination beam of the metrology apparatus. The four gratings thus are all simultaneously illuminated and simultaneously imaged on sensors 19 and 23. In an example dedicated to measurement of overlay, gratings 32 to 35 may comprise composite gratings formed by overlying gratings that are patterned in different layers of the semi-conductor device formed on substrate W. Gratings 32 to 35 may have differently biased overlay offsets in order to facilitate measurement of overlay between the layers in which the different parts of the composite gratings are formed. Gratings 32 to 35 may also differ in their orientation, as shown, so as to diffract incoming radiation in X and Y directions. In one example, gratings 32 and 34 are X-direction gratings with biases of the +d, −d, respectively. Gratings 33 and 35 are Y-direction gratings with offsets +d and −d respectively. Separate images of these gratings can be identified in the image captured by sensor 23. This is only one example of a target. A target may comprise more or fewer than 4 gratings, or only a single grating.

FIG. 5(f) shows an example of an image that may be formed on and detected by the sensor 23, using the target of FIG. 5(e) in the apparatus of FIG. 5(a), using the aperture plates 13NW or 13SE from FIG. 5(d). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the targets are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process.

Position Measurement Corrected for at-Resolution Feature Mismatch

Figure 6:
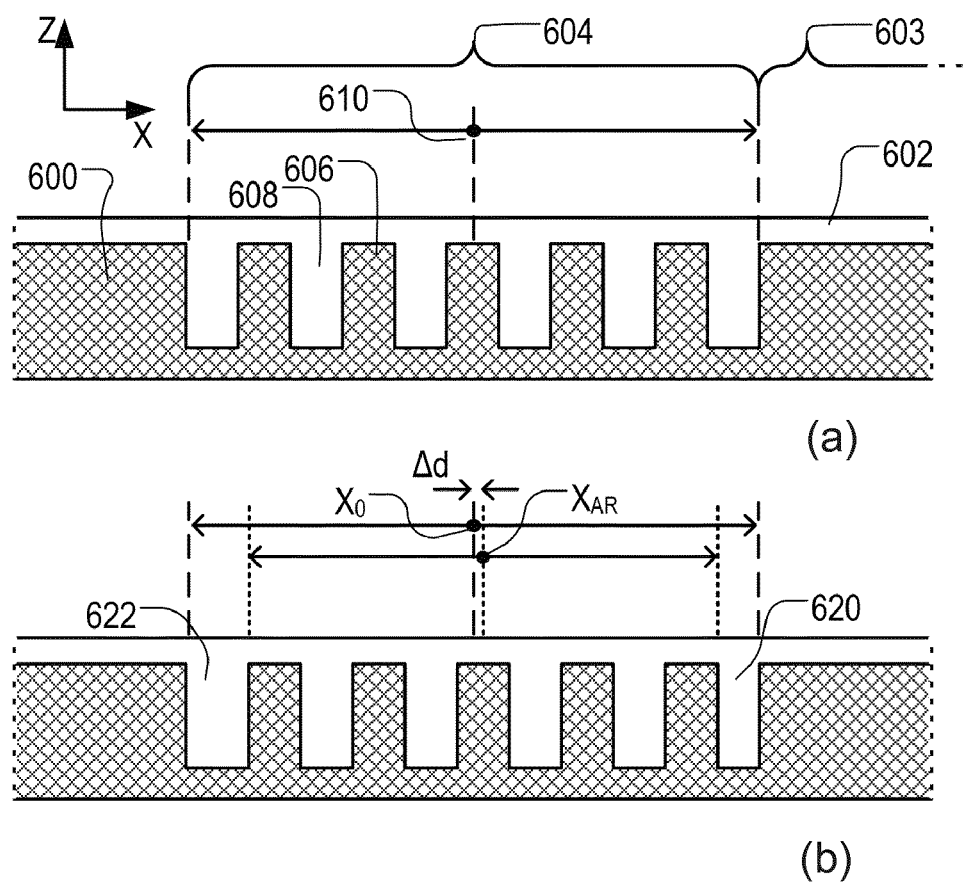
FIG. 6 is a detailed schematic cross-section of an alignment target with at-resolution features (a) without and (b) with mismatch between coarse and at-resolution feature positions.

Referring now to FIG. 6 the phenomenon of mismatch between the position of a coarse alignment grating and fine "at-resolution" features (including product features), referred herein as "mark print error", is described. Such a coarse alignment grating and fine "at-resolution" features together may form a practical "sub-segmented" alignment target. FIG. 6(a) shows in cross-section a small portion of an alignment target such as the X-direction alignment target 202 in FIG. 3(a). Specifically shown is roughly one repeating unit, comprising a target-space pattern that is repeated with a known periodicity, to form the whole alignment target. The target is formed in materials 600, 602 having different refractive indices, arranged in a periodic pattern whose repeating unit comprises "mark" regions 603 and "space" regions 604. The mark-space pattern may in particular be formed by etching or developing a pattern that is applied to a substrate using the lithographic apparatus of FIG. 1 or a similar apparatus. The designations "mark" and "space" in such a pattern are quite arbitrary. In fact, it will be noted that each "space" region 604 of the target is formed such that the material 600 is not uniformly absent, but is rather present in a fine-pitch grating pattern comprising smaller targets 606 and spaces 608. Similarly, each "mark" region 603 may be formed such that the material 600 is not uniformly present, but is present in a similar fine pitch grating pattern. In that case, this fine pitch pattern has a periodicity in the Y direction, that is into the page, and is therefore not visible in the cross-sections shown in FIG. 6. These finer targets and spaces are what is referred to herein as the "at-resolution" features, being at or close to the limit of resolution of the projection system in the lithographic apparatus that will use them, and therefore closer to the resolution of product features on the substrate. They may also be referred to as "sub-resolution" features as far as the alignment sensor AS shown in FIGS. 1 and 4 is concerned. A target containing these at-resolution features (in combination with a coarse grating) is commonly referred to as a 'sub-segmented target'. Sub-segmented targets are currently used to minimize processing effects of the alignment targets and to obey pattern density requirements posed by end users.

Ideally, the fine grating formed by targets 606 will be centered on the same point 610 as the coarse grating. This point 610, averaged over all the marks in the grating, may define a central reference position of the whole target. However, target 606, as with all exposed structures, is sensitive to lens aberrations in the process by which the target is formed. Finer features, such as product features and the at-resolution features of target 606, show a different sensitivity to lens aberrations compared to that of the coarse grating of target 606; the coarse grating usually having a pitch that is orders of magnitude larger than the at-resolution features. As a result of this, the lens aberrations can cause a shift between the at-resolution features and the coarse grating. It is assumed that the at-resolution features of the target 606 have the same position shift as the surrounding product features, and therefore the shift between the at-resolution features and the coarse grating of target 606 is representative of the mark print error.

FIG. 6(b) shows the form of such a sub-segmented grating, similar to the ideal form (a) but exhibiting a shift or mismatch between the coarse alignment grating pitch and the at-resolution features. This grating has become asymmetric due to a shift between the larger alignment pitch and the at-resolution structures. A space 620 at one end of region 604 the sub-segmented space portion has become slightly narrower than space 622 at the other end. The at-resolution grating therefore has a central point at a position $X_{AR}$ which is not exactly coincident with the central point $X_0$ of the coarse alignment grating. A mismatch or shift $\Delta d$ represents the difference between $X_0$ and $X_{AR}$, and may be measured for example in nanometers The asymmetric nature of the sub-segmented alignment grating causes an alignment sensor to measure a color dependent alignment signal. While the design of other types of alignment sensor may be different, in general the measured position of the target will be different for different wavelengths and illumination conditions. The color dependent alignment position is to a good approximation a linear function of the mismatch between the at-resolution features and the alignment grating pitch. The observation of linearity both in the alignment position offset as well as in the color to color is what may be exploited to obtain position measurements corrected for the (unknown) mark print error in the sub-segmented targets.

Figure 7:
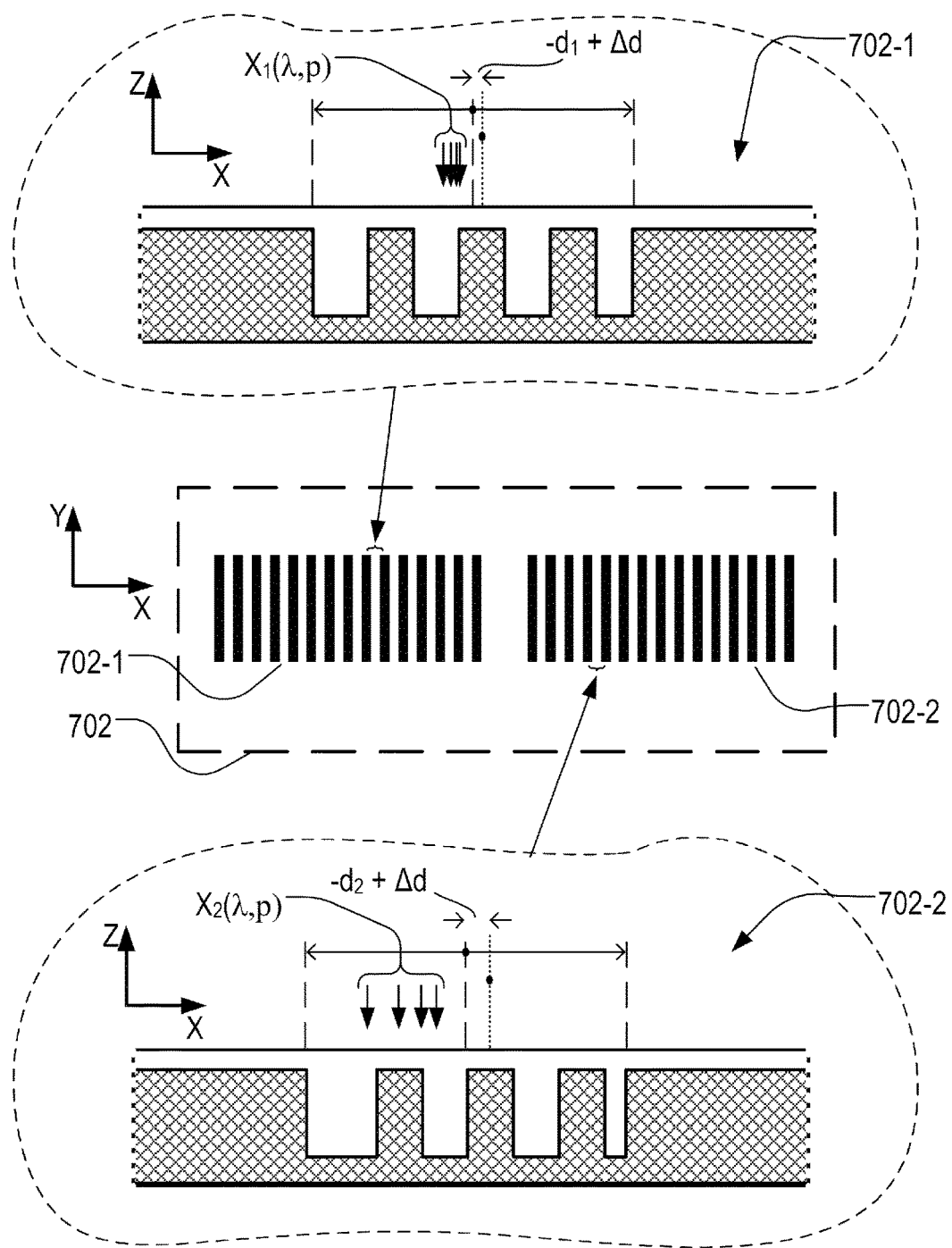
FIG. 7 shows in plan and cross-section a two-part differential alignment target in accordance with an embodiment of the present invention.

FIG. 7 illustrates the structure of a modified target 702 for use in exploiting the principle presented above. Such a target may be referred to as a differential sub-segmented target (DSM target). DSM targets may be used to measure the mismatch $\Delta d$ between the coarse grating and at-resolution features and/or the actual position of the of the at-resolution features. This mismatch $\Delta d$ is a measure of the mark print error between the coarse grating features and product features exposed on the substrate.

DSM target 702 may be a DSM alignment target which can be used in place of the simple alignment target 202. Versions with Y direction and XY direction can be readily envisaged also. The DSM target 702 is effectively a composite target having two segments 702-1 and 702-2. Each segment is itself a target comprising a sub-segmented grating of the general form illustrated in FIG. 6. Nearby would also be provided coarser structures by which the target can be "captured" by the sensor in a preliminary step. Such details are well known to the skilled reader. A schematic cross-section of first segment 702-1 is shown at the top of the drawing, while a cross-section of second segment 702-2 is shown at the bottom. In the cross-sections, as in FIG. 6, only one of the repeating units of the overall pattern is shown, centered on a space region. Only three at-resolution targets are shown, and shifts are exaggerated for clarity. A real target would have in the region of ten to twenty at-resolution targets and spaces in each space region of the larger pattern. In each segment there is both an unknown mark print error $\Delta d$ caused by aberration or the like during formation of the target, and a known offset d. The unknown mark print error is equal (or assumed equal) for the two segments, while the target is designed so that the first segment has an offset $d_1$ which is known and different from the offset $d_2$ applied in segment 702-2. In an embodiment, the offsets $d_1$, $d_2$ may be positive and negative values of equal magnitudes so as to balance the deliberate offset d either side of zero (that is, $d_1=-d_2$). However, the method to be described works with unequal magnitudes and with offsets that are both in the same direction. Similarly, the offset does not need to be either larger or smaller than the unknown mark print error. The example illustrated in FIG. 6 has offsets in opposite directions, but with magnitudes less than the (unknown) mark print error $\Delta d$. Therefore the total offset is in the same direction both segments.

The typical process flow for measuring alignment including the mark print error between the at-resolution features (and by extension, the product structures) and the alignment grating pitch is as follows. A substrate has one or more targets formed on it to serve as position measurement targets (alignment targets) in the lithographic process. Typically many targets are formed across the substrate. Each target comprises sub-segmented gratings formed by a lithographic process in which optical aberrations or other causes introduce an unknown mark print error Δd between the positions of the coarse alignment grating and at-resolution features within target or space regions of the grating. Each target is formed with two or more segments having different known offsets d in addition to the unknown mark print error. At a later time, after many intervening processing steps such as etching, the substrate is loaded into a lithographic apparatus for the purpose (in this example) of applying a device pattern. For example, the alignment targets may be applied before any device pattern is applied. More commonly, the alignment targets may be exposed in a first layer along with other first layer structures, and then used for alignment of the substrate during exposure of a second layer and other subsequent layers. The alignment sensor AS of the apparatus is used to obtain two or more measurements of the position of the DSM alignment target with different combinations of wavelength and polarization. Using these positional measurements, corrected for the effect of the mark print error as will be described, the second layer is applied accurately relative to the first layer. This process may be repeated for subsequent layers; for example, the second layer may also comprise (e.g., DSM) alignment targets for positioning of a third layer, and so on.

A problem with this methodology is that the DSM alignment targets, and DSM targets generally, are negatively affected by some processing steps, particularly etching, performed on the substrate after formation of the DSM alignment targets. This reduces the accuracy of the mark print error corrections calculated using the DSM targets, and therefore reduces the accuracy of layer-to layer alignment (overlay).

Figure 8:
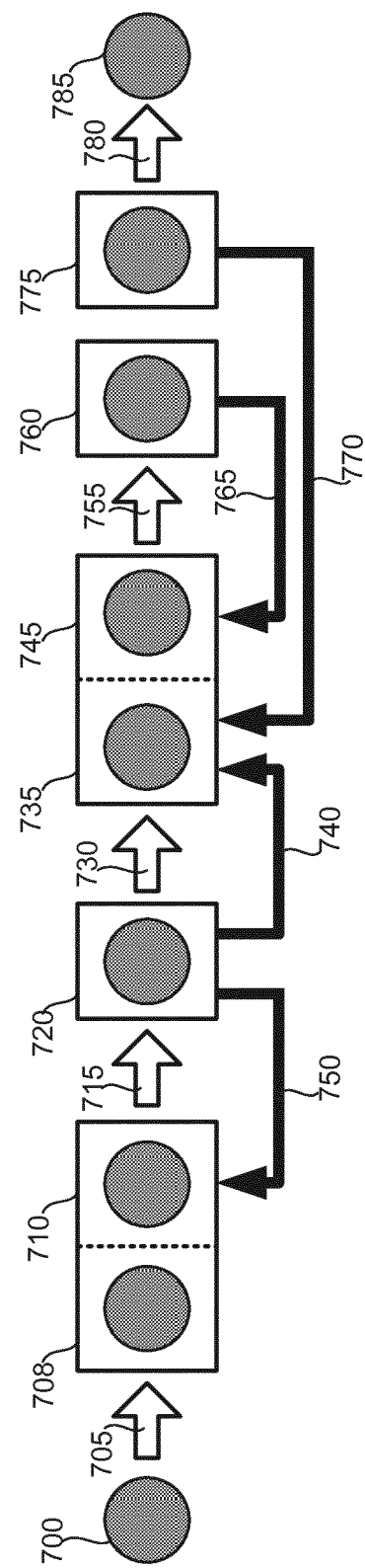
FIG. 8 is a flow diagram illustrating a method according to an embodiment of the invention.

FIG. 8 shows schematically an exemplary process flow for mitigating the above problem. A substrate 700 is introduced 705 into a lithography apparatus. The lithography apparatus may be a two stage lithography apparatus, similar to FIG. 1, comprising an alignment stage and a lithography stage (note that both stages are used interchangeably for measurement and exposure). Alternatively, these processes may be performed sequentially on a single stage. At a step 708, an alignment is performed. Accurate positioning of the first layer is not so critical, as there are no other structures to align with. As such, no alignment targets are required at this step, and a coarser pre-alignment by the substrate handler is sufficient, using (for example) the substrate edge as reference. At step 710, a first layer is exposed, the first layer comprising alignment targets for alignment of a second layer. In an embodiment, the alignment targets may be DSM alignment targets 702 as already described. In an alternative embodiment, more conventional alignment targets may be formed in combination with DSM targets which enable separate measurement of mark print error. These variants will be described in more detail later.

Following the formation of the first layer as described, the substrate is developed 715. However, other process steps such as etching are not performed yet. Instead, at step 720, the DSM targets are measured in the developed resist. These measurements are performed for determining the mark print error between positions of a coarse alignment grating and at-resolution features in the first layer. The inventors have determined that these measurements can be performed with greater accuracy on DSM targets immediately subsequent to developing, but prior to other processing steps, most notably etching. Step 720 may be performed by the lithographic apparatus using the alignment sensor, such as illustrated in FIG. 1 or 4. However, to do this requires the substrate to be removed from the lithographic apparatus after exposure of the first layer for development, and then reloaded into the lithographic apparatus for the sole purpose of performing these DSM target measurements, before being removed once again for the other processing steps. Because the mark print error varies from substrate to substrate and field to field it should be measured on every substrate, and on at least a representative set of DSM targets. Therefore, it is likely that performing these DSM target measurements within the lithographic apparatus will have a high productivity penalty.

Therefore, in an alternative variant, the mark print error is determined from measurements performed using a metrology apparatus, such as that described in FIG. 5. Depending on the target characteristics (particularly pitch), the measurements may be performed by the metrology apparatus directly on DSM alignment targets. Where the alignment targets have characteristics incompatible with the metrology apparatus, then DSM metrology targets which are compatible with the metrology apparatus can be exposed and measured. In both cases normal alignment targets may be used for alignment, since these take less time to measure. The DSM metrology targets may be positioned close to the alignment targets. However, to maximise throughput, it may be that only a few DSM metrology targets are measured compared to the 20 to 40 alignment targets which are typical.

Following processing 730 of the substrate (e.g., etching), the substrate is reintroduced into the lithographic apparatus and an alignment step 735 is performed. The calculations of mark print error (or calculated corrections based thereon) obtained at step 720 are fed forward 740 and used to correct the alignment measurements obtained at alignment step 735. Following this, the second layer is exposed 745.

Additional, optional, steps and refinements are also illustrated in FIG. 8. For example, the calculations of mark print error (or calculated corrections based thereon) obtained at step 720 can be fed back 750 and used to correct one or more lithographic apparatus parameters during first layer exposures on subsequent substrates, so as to attempt to reduce the mark print error. Also shown after second layer exposure 745 is a development step 755 to develop the substrate; this step comprises no other processing steps which may asymmetrically deform the DSM target, such as etching. Following this, there may be a further measurement of DSM targets 760 and determination of mark print error within the second layer. This can then be fed back 765 and used to correct one or more lithographic apparatus parameters during second layer exposures on subsequent substrates. The mark print error within the second layer can also be used, of course, to correct alignment measurements for exposure of a third layer, if required. Step 760 may be performed in a metrology apparatus, in which case overlay measurements 770 may also be performed and fed back 775 for correcting alignment of the second layer 735. Steps 760 and 770 may be performed simultaneously on, for example, a combined overlay and DSM target. Additional layers may be exposed, with the mark print error (and optionally overlay) being measured in the same way for each layer. Finally, the substrate will undergo final processing 780, resulting in processed substrate 785.

Measuring the mark print Error in a Metrology Apparatus

As previously mentioned, measuring the mark print error in resist (i.e., after developing but before etching and other processing steps) using the lithographic apparatus may result in too great a productivity penalty, due to the requirement to repeatedly eject and reload the substrate from/to the lithographic apparatus. Consequently, it may be preferred in other embodiments, to measure the mark print error from DSM targets in resist using a metrology apparatus, such as that illustrated in FIG. 5(a). WO2015/062854, which is incorporated herein by reference, discloses that that offsets between the at-resolution features and the coarse grating can be measured through asymmetry signals in the same way as overlay is measured, e.g., from differences in measured intensities of corresponding (non-zeroth) diffraction orders.

FIG. 9 is a flowchart of the steps of a method performing an alignment operation according to an exemplary embodiment. The steps are as follows, and are then described in greater detail thereafter:

S1—Expose first layer including DSM metrology targets;
S2—Measure −1st order scatterometry image using 1st illumination mode;
S3—Measure +1st order scatterometry image using 2nd illumination mode;
S4—Recognize & extract each grating ROI from each image;
S5—Calculate difference image of each grating to determine asymmetry;
S6—Calculate mark print error Δd;
S7—Complete processing and measure alignment target;
S8—Correct measurement of alignment targets using Δd; and
S9—Expose second layer.

FIG. 9 illustrates a method of performing an alignment operation which comprises measuring mark print error using DSM metrology targets (which may comprise the DSM alignment targets, or specific DSM metrology targets as expanded on below). In principle, this mark print error may be measured through asymmetry of the segments of the DSM metrology targets, as revealed by comparing their intensities in the +1 order and −1 order dark field images. At Step S1, the substrate, for example a semiconductor wafer, is exposed with DSM metrology targets (along with other first layer structures including, for example, alignment targets and/or product structures). The DSM metrology targets comprise gratings having coarse structures but also smaller-scale (at-resolution) sub-structures with programmed (known) offsets between the at-resolution sub-structures and the coarse grating structures. In this respect, the DSM metrology targets may take the same general form as, and may actually be, DSM alignment targets 702 of FIG. 7.

At Step S2, the developed, but otherwise unprocessed, and in particular unetched substrate (other non-etch processing steps known not to result in additional target asymmetry are allowable at this stage), is loaded into a metrology apparatus, such as (for example) the metrology apparatus of FIG. 5. Using the metrology apparatus, an image of the DSM metrology targets is obtained using only one of the first order diffracted beams (say −1). Then, whether by changing the illumination mode, or changing the imaging mode, or by rotating substrate W by 180° in the field of view of the metrology apparatus, a second image of DSM metrology targets using the other first order diffracted beam (+1) can be obtained (Step S3). Consequently the +1 diffracted radiation is captured in the second image. It is a matter of design choice whether all of the segments which make up the DSM metrology targets (and any other gratings which may be present, e.g., for measuring overlay) can be captured in each image, or whether the scatterometer and substrate need to be moved so as to capture the full DSM metrology target in one or more separate images. In either case, it is assumed that first and second images of all the component segments comprised within the DSM metrology target are captured via image sensor 23.

Note that, by including only half of the first order diffracted radiation in each image, the 'images' referred to here are not conventional dark field microscopy images. Each segment will be represented simply by an area of a certain intensity level. The individual grating lines will not be resolved, because only one of the +1 and −1 order diffracted radiation is present. In Step S4, a region of interest (ROI) is carefully identified within the image of each component segment, from which intensity levels will be measured. This is done because, particularly around the edges of the individual segment images, intensity values can be highly dependent on process variables such as resist thickness, composition, line shape, as well as edge effects generally.

Having identified the ROI for each individual segment and measured its intensity, the asymmetry of the grating structure, and hence mark print error, can then be determined. At Step S5, the image processor and controller PU compares the intensity values obtained for +1 and −1 orders for each segment to identify any difference in their intensity. At Step S6 the mark print error is determined from the intensity differences and the knowledge of the known offsets d within the segments. This is performed using methodology well known to skilled person for measuring overlay (layer-to-layer mismatch) of a grating using a metrology device such as illustrated in FIG. 5(a), wherein the known offsets d between at resolution features and the coarse grating are treated analogously to the known offsets between different layers in the overlay measurement.

At Step S7, the substrate is further processed and then reintroduced into the lithographic apparatus for application of a device pattern in a second layer. During this step, alignment measurements are performed on the alignment targets. These alignment measurements may be conventional alignment measurements of a coarse alignment grating only, to obtain a position for the alignment grating.

In Step S8, using the alignment measurements and the calculated mark print error Δd from Step S6, the position of the alignment grating is corrected for the calculated mark print error.

At Step S9, the substrate is positioned based on corrected alignment measurements and second layer exposed.

The alignment measurement error resulting from a mark print error is sensitive to additional layers and structures (the stack) applied to the substrate. When differential targets (e.g., DSM metrology and/or DSM alignment targets) are measured, the effect of this sensitivity is cancelled and therefore this effect may be ignored when DSM targets are used for alignment. However, it is envisaged in some embodiments (as described above) that the actual alignment measurement may be performed on a conventional coarse alignment grating, and then corrected using a mark print error value measured from a DSM target in resist. As such, the mark print error value obtained from measurement of the DSM metrology target in resist will not be truly representative of the alignment measurement error of the conventional coarse alignment target on the processed substrate (with overlaid stack) which is to be measured. As a consequence, the correction applied to the alignment measurement may be incorrect.

It is therefore proposed, where a non-differential alignment target is to be measured for the actual alignment, that a process calibration step is performed to determine this alignment measurement error stack sensitivity. The process calibration step may be performed on one or more test substrates in an initial stage prior to production. In an embodiment, the process calibration step may comprise the following steps:

Forming one or more DSM alignment targets (e.g., having a coarse grating with the same pitch as the alignment targets which will be measured during production) on the test substrate;

Performing processing steps to form the stack on the substrate (e.g., the substrate is processed such that it is in a condition which is the same or similar to the condition it will be during a relevant alignment step);

Performing a calibration measurement of the more DSM alignment target(s); and

Determining the alignment measurement error stack sensitivity from the calibration measurement;

The calibration measurement of the DSM alignment target will not only yield a mark print error value, but also the sensitivity of the alignment measurement to a certain offset, since the DSM alignment target comprises two segments with different (e.g., equal and opposite) offsets of the fine pitch (subsegments) with respect to the coarse pitch. This sensitivity can therefore be determined from the measurement. This sensitivity may be wavelength dependent and therefore may be determined for the wavelengths that will be used for the actual alignment measurements. For example, a measured (wavelength dependent) alignment position of a first segment $X_1(\lambda)$ (having deliberate offset $d_1$) and a measured (wavelength dependent) alignment position of a second segment $X_2(\lambda)$ (having deliberate offset $d_2$) may comprise:

$$X_1(\lambda)=X_0+K(\lambda)[d_1+\Delta d]$$

$$X_2(\lambda)=X_0+K(\lambda)[d_2+\Delta d]$$

where $K(\lambda)$ is the alignment measurement error stack sensitivity. It will be readily appreciated that, provided measurements are made with different wavelengths, these equations can be solved for the alignment measurement error stack sensitivity $K(\lambda)$ This is only an exemplary method of determining the alignment measurement error stack sensitivity. Other methods are possible, for example, by performing scanning electron microscope measurements within the stack.

This process calibration step may be performed for each different stack or structure formed on the substrate, to obtain an alignment measurement error stack sensitivity value corresponding to each stack.

With the process calibration step having been performed, the alignment measurement error stack sensitivity (e.g., corresponding to the relevant stack/structure which is to be formed over the alignment target), along with the measurement of mark print error made on a DSM target in resist, can be used to correct subsequent measurements of non-differential alignment targets during production (e.g., at step 720 of the above method).

It will be appreciated that the determination of the alignment measurement error stack sensitivity in the manner described may result in the determined stack sensitivity comprising a contribution resulting from the etching of the DSM alignment target (the effect for which measurement of the DSM target in resist is proposed to mitigate). However, it can be shown that this degradation of the DSM alignment target by etching is significantly greater for DSM alignment targets at the edge of the substrate, while DSM targets at or near to the center of the substrate show little degradation from etching (the etching flow is substantially parallel here, which is not necessary the case nearer the edge). Consequently, in an embodiment it is proposed that the calibration measurement(s) are performed on DSM alignment targets in the vicinity of the center of the substrate and therefore it may be that DSM alignment targets formed in this processing calibration step are formed only in the vicinity of the center of the substrate.

Depending on the metrology apparatus specifications, in particular with regard to limits on the measurable pitch, the metrology apparatus may or may not be able to measure DSM alignment targets such as those illustrated in FIG. 7. Where, the metrology apparatus is able to measure DSM alignment targets, then these (or at least a subset of these) can be measured in resist using the metrology apparatus to obtain a determination of the mark print error, and then subsequently measured by the alignment sensor within the lithographic apparatus to perform alignment of the substrate. In such an embodiment, the alignment sensor need only measure the coarse alignment grating of the DSM alignment target, or a normal alignment target, and use the mark print error determination from the metrology apparatus to correct the alignment measurement of the coarse grating position for mark print error and/or to obtain an accurate measurement of the position of the at-resolution grating.

Where it is not possible to measure DSM alignment targets using the metrology apparatus, in another embodiment, specific DSM metrology targets may be formed on the substrate. In this regard, the DSM metrology targets may be generally of the same form as the DSM alignment targets illustrated in FIG. 7, possibly only differing in pitch or another parameter such that the target is compatible with, and can be inspected by, a specific metrology apparatus. Other examples of these DSM metrology targets will be described in detail later. A DSM metrology target may be formed within the vicinity of the alignment target which will be corrected by measurement of that DSM metrology target. However, as metrology measurements take significant time, it may be that fewer DSM metrology targets will be measured than the number of alignment targets. In an embodiment, fewer than 10 or fewer than six DSM metrology targets are measured. In another embodiment, only 2 or 3 DSM metrology targets are measured. The resultant corrections should be acceptable despite only using a few DSM metrology targets as the lens heating errors, which are the main cause of mark print error, vary only gradually over the substrate.

Where separate DSM metrology targets are used in addition to alignment targets, it may be assumed that the mark print error for the DSM metrology target is the same as that for the alignment targets, such that the measurement of mark print error for a DSM metrology target is used directly to correct measurements of one or more alignment targets. Alternatively, in another embodiment, an initial mark-to-mark calibration may be performed. The initial mark-to-mark calibration may be a one-time calibration, which calibrates for any difference between measurements of mark print error obtained from any DSM metrology target and the actual mark print error of an alignment target. As with the mark print error itself, such a difference may be as a result of the different coarse pitches of the DSM metrology target and the alignment target which have different sensitivity to lens heating effects, for example. Where only a few DSM metrology targets are to be measured, a mark-to-mark calibration may be performed between each of the alignment marks and its nearest measured DSM metrology target (or at least the DSM metrology target on which the correction for that alignment mark will be based). Such a mark-to-mark calibration assumes that, while the mark print error measurements as measured on DSM metrology targets and alignment targets may differ, they are sufficiently correlated.

Depending on the type of scatterometer used, each DSM metrology target may take a form similar to the overlay target depicted in FIG. 5(d), comprising x-aligned and y-aligned pairs of gratings, each pair comprising a grating with a first offset and a second offset. However, it should be appreciated that each of these DSM metrology targets are formed in a single layer with the offset being between coarse features and at-resolution features, while an overlay target is formed in two layers, with an offset between the gratings in each layer.

Where specific DSM metrology targets are formed, they may take the form of a combined DSM metrology and overlay target, such as disclosed in WO2015/062854. In an embodiment, the combined DSM metrology and overlay target may comprise a first layer DSM metrology target and an overlay target. In another embodiment, the combined DSM metrology and overlay target may additionally comprise a second layer DSM metrology target. The overlay target may comprise only coarse structures within the resolving power of the scatterometer, or may comprise at resolution features, but without different programmed offsets. Using such a combined DSM metrology and overlay target, steps 770 and 775 of FIG. 8 may be performed to obtain and feedback overlay measurements. Where the combined DSM metrology and overlay target has a second layer DSM metrology target, steps 760 and 765 of FIG. 8 may be performed to obtain and feedback a measurement of the mark print error of the second layer.

Measurement of the mark print error using a metrology apparatus can be performed not only on small targets using dark field scatterometry, but also to large targets and angle-resolved scatterometry using the pupil plane image sensor 19 (with reference to FIG. 5(a). For this example, a symmetric, segmented illumination profile may be used. Two diametrically opposite quadrants, labeled a and b, are bright in this aperture pattern (transparent), while the other two quadrants are dark (opaque). This type of aperture is known in scatterometry apparatus, from the published patent application US 2010/0201963. In such an embodiment, the gratings of the DSM metrology target will be underfilled within the illumination spot of the metrology apparatus. Whereas, in the example just described, detector 23 is used in an image plane corresponding to the plane of substrate W, angle resolved scatterometry uses the detector 19 that is positioned in a plane conjugate with a pupil plane of objective 16. Using the segmented illumination profile, a segmented illumination pattern can be obtained on detector 19 which can be exploited to obtain clear first order signals from a diffraction grating having a pitch which is half the minimum pitch that could be imaged if a conventional, circularly-symmetric illumination aperture were used. This diffraction pattern and the manner in which it can be exploited for scatterometry, are described in the known application US 2010/0201963. The main difference between the angle resolved scatterometery and the dark field scatterometery technique of FIG. 9 is as follows. Recall that the FIG. 9 method obtains an asymmetry signal for each grating of the DSM metrology target by comparing intensities of grating image as seen in first and second images captured with the sensor 23. By contrast, the angle resolved scatterometery method obtains an asymmetry signal for each grating by comparing intensities of the +1 and −1 diffraction orders extracted from within the same diffraction spectrum on pupil image sensor 19.

Measuring the Mark Print Error in the Lithographic Apparatus

Referring to the flowchart of FIG. 10, another embodiment of a method to obtain more detailed position measurements using a DSM alignment target, such as DSM alignment target 702 illustrated in FIG. 7, with segments and offsets d will be described. It is assumed that the measurements are performed as part of an alignment step in a lithographic apparatus such as that illustrated in FIG. 1, but the method can of course be applied to make position measurements for other purposes. A simple example will be presented using just two segments of the type shown in FIG. 7 and two wavelength/polarization combinations to measure position in one direction. More complexity can be added in a real implementation, if desired. The steps of this method can be combined with the performance of other measurements using the same targets. Fewer steps can be applied, if desired, for example, because only one particular result is desired to be output. The techniques disclosed herein are in no way limited to these particular examples, or to any particular form or mathematical expression. The concepts explained here can be expressed in many different notations and algorithms, while still applying the basic principles disclosed here.

FIG. 10 is a flowchart of the steps of a method performing an alignment operation according to an exemplary embodiment. The steps are as follows, and are then described in greater detail thereafter:

S11—Expose first layer including DSM alignment targets;
S12—Measure DSM alignment targets in resist for different ($\lambda$,p);
S13—Calculate $\Delta X$ for each segment of DSM alignment targets;
S14—Calculate mark print error $\Delta d$;
S15—Complete processing and measure alignment target;
S16—Correct measurement of alignment targets and/or measure position of at-resolution grating using $\Delta d$; and
S17—Expose second layer.

In Step S11, during exposure of a first layer, a substrate has one or more targets formed on it to serve as position measurement targets (DSM alignment targets) in the lithographic process. Typically many targets are formed across the substrate. Each target comprises sub-segmented gratings formed by a lithographic process in which optical aberrations or other causes introduce a mark print error $\Delta d$ between the positions of the coarse alignment grating and at-resolution features within target or space regions of the grating. Each target is formed with two or more segments having different known offsets d in addition to the mark print error.

At a later time, in Step S12, after development of the substrate but before any other processing steps, the substrate is loaded into a lithographic apparatus for the purpose (in this example) of measuring the DSM alignment targets (or at least a subset thereof) so as to determine the mark print error $\Delta d$. In this step, alignment sensor AS of the apparatus is used to obtain two or more measurements $X_1$ of the position of first target segment 702-1 with different combinations of wavelength and polarization ($\lambda$,p); and two or more measurements $X_2$ of the position of second target segment 702-2 with the same combinations of wavelength and polarization ($\lambda$,p).

In Step S13 at least one position difference $\Delta X$ is calculated by comparing the different positions measured for the first segment in Step S12. Additionally, a position difference $\Delta X$ is calculated by comparing the different positions measured for the second segment, using the corresponding pair of positions measured in Step S12. Each ΔX corresponds to the same pair of wavelengths and/or polarizations. If multiple measurements are made, the best pair to use may be selected according to a predetermined recipe, and/or according to quality evaluation done at the time of measurement. There is nothing to prevent more than two pairs being used to obtain multiple ΔX values for each segment.

In Step S14 the values of ΔX for the two segments are combined with values of the known offsets d to calculate the mark print error Δd. Referring again to the example target illustrated in FIG. 7, the combined shift −d2+Δd in the second segment is shown as being greater in magnitude than the combined shift −d1+Δd in the first target. The measurements of target position X that are reported by the sensor for different colors and polarizations in the second segment are much more widely spaced, and much further from the true position of either the coarse or at-resolution grating, than the positions reported for the first segment. In terms of the calculation, the position difference ΔX calculated for the second segment will be much greater than ΔX calculated for the first segment.

As disclosed in WO2014/014906, Δd can be derived as:

$$\Delta d = \frac{d_1 - Cd_2}{C-1}$$

where:

$$C = \frac{X_1(\lambda_1) - X_1(\lambda_2)}{X_2(\lambda_1) - X_2(\lambda_2)} = \frac{[d_1 + \Delta d]}{[d_2 + \Delta d]}$$

and $X_n(\lambda_m)$ is the position of the alignment grating measured in the nth measurement using wavelength/polarization combination m.

At Step S15, the substrate is further processed and then reintroduced into the lithographic apparatus for application of a device pattern in a second layer. During this step, the substrate is positioned based on alignment measurements performed on the DSM alignment targets. These alignment measurements may be conventional alignment measurements of the coarse alignment grating only.

In Step S16, using the alignment measurements and the calculated mark print error Δd from Step S14, one or both of the following can be determined: (i) the true center position $X_0$ of the coarse alignment grating and (ii) the true center position $X_{AR}$ of the at-resolution grating.

The true center position $X_0$ of the coarse alignment grating can be calculated by:

$$X_0 = X_1(\lambda) - K(\lambda)[d_1 + \Delta d]$$
$$= X_1(\lambda) - \frac{X_1(\lambda) - X_2(\lambda)}{[d_2 - d_1]}\left[d_1 + \frac{d_1 - Cd_2}{C-1}\right]$$

where $K(\lambda)$ is unknown and depends on many properties of the target and its overlying and underlying stack.

The center position $X_{AR}$ of the at-resolution grating can also be calculated by:

$$X_{AR} = X_0 + \Delta d$$

In Step S17, after measuring all the desired targets, operating the level sensor and so forth, a product or device pattern is applied at the target portions C of the substrate W (FIG. 1) using the projection system PS of the lithographic apparatus. While the measured coarse grating position $X_0$ is already more accurate than performing alignment measurements on a coarse grating alone, note that the at-resolution $X_{AR}$ position is also directly available, despite these features being far below the resolving power of the alignment sensor. This raises the possibility to use the at-resolution position $X_{AR}$ in the positioning of the applied pattern. Since the at-resolution features are more like the product features in the applied pattern, using this position measurement may give more accurate placement of those product features than the coarse grating position $X_0$ (assuming that the aberrations in the litho step will be similar to the ones in the step that formed the target). After further lithographic steps, a finished semiconductor device or other product has been formed on the substrate.

The steps of the method can be performed in any desired sequence. The steps S2-S4 of calculation may be performed as discrete steps, or merged into a single larger calculation. Detector signals may be stored for all targets, and processed to obtain position measurements at a later stage.

The target segments in the examples above are shown in close proximity, so that they may be considered as being at substantially the same location on a large substrate, and may be measured in a single pass of the sensor. A combined position measurement can then be output to be used in the same manner as a conventional target. In principle, the two segments could be more widely separated. One attraction of such a step would be to avoid a great overall increase in the area occupied by targets on the substrate. However, the quality of results will depend on whether the mismatch Δd is the same at all locations, or needs to be measured locally to be meaningful. Processing the measurement results and using them in alignment or for other purposes after measurement will be more complicated.

Hence the differential segmented target alignment strategy is able to recover the position of the at-resolution structure based on a combination of the known different offsets of the target segments ($d_1$, $d_2$) and measurable parameters (in this case a color to color difference measured at segment 1 and a color to color difference measured at segment 2). The technique is further independent of the particular type of alignment sensor used, and can be applied with other sensors and not only one based on the self-referencing interferometer shown in FIG. 4.

The skilled person will recognize that pairs of position measurements can be used whose difference is in only one of the parameters: wavelength, polarization, illumination profile and special frequency spectral component. Equally, pairs of position measurements can be used that differ in more than one of these parameters at the same time.

CONCLUSION

The concepts disclosed herein allow correction of mark print error without the need for additional target measurements during substrate alignment. The availability of mark print error measurements in the process correction system enables corrections to be determined as part of a feedback loop in order to prevent or reduce mark print errors on subsequent substrates or lots (for example by reducing lens heating effects). Additionally, where measured mark print errors are determined to be extreme (e.g., above a threshold), an alarm may be raised. This could prompt a user to rework the affected lot, so as to prevent yield loss.

It should be understood that the processing unit PU which controls alignment sensor, processes signals detected by it, and calculates from these signals position measurements suitable for use in controlling the lithographic patterning process, will typically involve a computer assembly of some kind, which will not be described in detail. The computer assembly may be a dedicated computer external to the apparatus, it may be a processing unit or units dedicated to the alignment sensor or, alternatively, it may be a central control unit LACU controlling the lithographic apparatus as a whole. The computer assembly may be arranged for loading a computer program product comprising computer executable code. This may enable the computer assembly, when the computer program product is downloaded, to control aforementioned uses of a lithographic apparatus with the alignment sensor AS.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The invention may further be described using the following clauses:

1. A method of measuring positions of at least one alignment target on a substrate using an optical system, the method comprising:
(a) measuring at least one sub-segmented target by illuminating said sub-segmented target with radiation and detecting radiation diffracted by said sub-segmented target using one or more detectors to obtain signals containing positional information of the sub-segmented target, this step being performed on the sub-segmented target when said sub-segmented target is still in resist, the sub-segmented target comprising structures arranged periodically in at least a first direction, at least some of said structures comprising smaller sub-structures, each sub-segmented target being formed with a positional offset between the structures and the sub-structures that is a combination of both known and unknown components;
(b) using said signals, together with information on differences between the known offsets of said sub-segmented target, to calculate a measured position of at least one alignment target which is corrected for said unknown component of said positional offset.

2. A method of measuring positions of at least one alignment target on a substrate using an optical system, the method comprising:
(a) measuring at least one sub-segmented target by illuminating said sub-segmented target with radiation and detecting radiation diffracted by said sub-segmented target using one or more detectors to obtain signals containing positional information of the sub-segmented target, each sub-segmented target being formed with a positional offset between structures and smaller sub-structures that is a combination of both known and unknown components;
(b) using said signals, together with information on differences between the known offsets of said sub-segmented target, to calculate a measured position of at least one alignment target which is corrected for said unknown component of said positional offset.

3. A method according to clause 1 or 2, wherein step (a) is performed on the sub-segmented target after it has been exposed and developed, but prior to any etching step being performed.

4. A method according to clause 1, 2 or 3, wherein step (b) comprises determining a measure of asymmetry in the sub-segmented target and using this measure of asymmetry to correct for said unknown component of said positional offset when calculating the measured position of the at least one alignment target.

5. A method according to any preceding clause, wherein in step (a) a plurality of signals containing position information are obtained for said at least one sub-segmented target, each signal being obtained using radiation having different characteristics.

6. A method according to clause 5, wherein the calculation in step (b) is based at least partly on the assumption that a relationship between the position information contained in a signal and the positional offset of a target has the same mathematical form for each of said plurality of signals.

7. A method according to clause 6, wherein said relationship is assumed to be a linear relationship.

8. A method according to any of the clauses 5 to 7, wherein said radiation having different characteristics includes radiation having different wavelengths, polarizations and/or illumination profiles.

9. A method according to any preceding clause, wherein said at least one sub-segmented target comprises at least two segments having different known offsets between the structures forming the target and the sub-structures within them, the two or more segments being formed in close proximity so as to form a composite target.

10. A method according to any preceding clause, wherein said signals obtained at step (a) are further used to determine corrections for subsequent substrates, said corrections for reducing the magnitude of the unknown component of said positional offset in said subsequent substrates.

11. A method according to any preceding clause, wherein fewer sub-segmented targets are measured in step (a) than there are alignment targets for which a corrected measured position is calculated in step (b), such that corrected measured positions of a plurality of said alignment targets are corrected using signals from the same sub-segmented target.

12. A method according to clause 11, comprising a mark-to-mark calibration step to calibrate out differences in the unknown component of the positional offset in said sub-segmented targets and the unknown component of the positional offset of said alignment targets.

13. A method according to any preceding clause, wherein step (a) is performed using an inspection apparatus.

14. A method according to clause 13, wherein step (a) determines at least one correction for said calculation of a measured position of at least one alignment target, said calculation further using measurements of the at least one alignment target performed during positioning of a substrate on a lithographic apparatus.

15. A method according to clause 13 or 14, wherein said calculating a measured position of at least one alignment target at step (b) comprises calculating a measured position of said at least one sub-segmented target, said at least one sub-segmented target at step (a) being the same target as said at least one alignment target at step (b).

16. A method according to clause 13 or 14, wherein said calculating a measured position of at least one alignment target at step (b) comprises calculating a measured position of a target other than said at least one sub-segmented target.

17. A method according to clause 16, wherein said sub-segmented target comprises structural characteristics compatible with said inspection apparatus.

18. A method according to clause 16 or 17, wherein said sub-segmented target further comprises an overlay sub-target for measuring a positional mismatch between structures on different layers and said method further comprises calculating said positional mismatch between structures on different layers; and using said positional mismatch in calculating corrections for subsequent exposures.

19. A method according to any of clauses 16 to 18, wherein said at least one alignment target measured at step (b) comprises a non-differential alignment target and said method further comprises performing a process calibration step to determine a sensitivity of the unknown component of said positional offset to overlaid structures having been formed in one or more layers overlaying said alignment target; and using said sensitivity to correct the measurement performed at step (a).

20. A method according to clause 19, wherein said process calibration step comprises:
forming one or more test sub-segmented alignment targets on a test substrate;
forming one or more overlaid structures, corresponding to the overlaid structures which will have been formed prior to step (b) during production, in one or more layers overlaying said test sub-segmented alignment target on said substrate;
performing a calibration measurement of the one or more test sub-segmented alignment targets; and determining said sensitivity from the calibration measurement.

21. A method according to clause 20, wherein said test sub-segmented alignment target is formed in the vicinity of the center of said test substrate.

22. A method according to any of clauses 19 to 21, wherein said process calibration step is repeated for each of the different overlaid structures which will have been formed prior to step (b) during production to obtain a sensitivity measurement corresponding to each of said different overlaid structures.

23. A method according to any of clauses 1 to 12, wherein step (a) is performed using a lithographic apparatus.

24. A method according to clause 23, wherein step (a) is performed using the alignment sensor of the lithographic apparatus.

25. A method according to clause 24, wherein step (b) is performed using said alignment sensor.

26. A method according to any of clauses 23 to 25, wherein said calculating a measured position of at least one alignment target comprises calculating a measured position of said at least one sub-segmented target, said at least one sub-segmented target at step (a) being the same target as said at least one alignment target at step (b).

27. A method according to clause 26, wherein step (b) outputs a position measurement for the sub-segmented target that is referenced to the positions of said sub-structures in said sub-segmented target, including said unknown offset, rather than to the positions of said structures without said unknown offset.

28. A method according to clause 26 or 27, wherein there are a plurality of sub-segmented targets, and said method comprises calculating a measured position for each of the sub-segmented targets which is corrected for said unknown component of said positional offset.

29. A method of manufacturing devices, wherein a device pattern is applied to a substrate using a lithographic process, the method including positioning the applied pattern by reference to a measured position of at least one alignment target formed on the substrate, the measured position being obtained by a method according to any preceding clause.

30. A method according to clause 29, comprising the steps of:
exposing a first layer comprising said at least one sub-segmented target and said at least one alignment target, either separately or as a single target;
wherein the step of positioning the applied pattern is performed during exposure of layers subsequent said first layer.

31. A method according to clause 30, comprising, subsequent to said exposing a first layer:
performing a development step to develop resist on said substrate;
performing step (a); and subsequent to these steps:
performing additional processing steps on said substrate;
performing an alignment operation for said positioning of said applied pattern in a second layer, wherein said alignment operation comprises performing step (b).

32. A method according to clause 30 or 31, wherein said signals obtained at step (a) are further used to determine corrections for subsequent substrates, said corrections for reducing the magnitude of the unknown component of said positional offset in said subsequent substrates; said method further comprising applying said corrections in the exposure of a first layer on said subsequent substrates.

33. A method according to clause 30, 31 or 32, comprising:
forming at least one additional sub-segmented target in a layer subsequent to said first layer;
illuminating said at least one additional sub-segmented target with radiation and detecting radiation diffracted by said sub-segmented target using one or more detectors to obtain additional signals containing positional information of the additional sub-segmented target; and
using said additional signals to determine additional corrections for subsequent substrates, said additional corrections for reducing the magnitude of the unknown component of said positional offset in a corresponding layer of said subsequent substrates.

34. A method according to any of clauses 30 to 33, comprising:
additionally measuring an overlay target for measuring a positional mismatch between structures on different layers and said method further comprises calculating said positional mismatch between structures on different layers;
determining a positional correction based on said calculated mismatch; and
on a subsequent substrate, applying the positional correction during positioning of the applied pattern during exposure of at least one of the layers corresponding to the layers of said overlay target.

35. A lithographic apparatus comprising:
   a patterning subsystem for transferring a pattern to a substrate; and
   a measuring subsystem for measuring positions of said substrate in relation to the patterning subsystem,
wherein the patterning subsystem is arranged to use the positions measured by the measuring subsystem to apply said pattern at a desired position on the substrate and wherein the measuring subsystem is arranged to position the applied pattern by reference to a measured positions of at least one alignment target provided on the substrate and wherein the measuring subsystem is arranged to calculate said measured position of said at least one alignment target by a method according to any of clauses 23 to 28.

36. A lithographic apparatus according to clause 35, further being operable to the method of manufacturing devices according in any of clauses 29 to 33.

37. A lithographic cell comprising a lithographic apparatus and an inspection apparatus, said lithographic apparatus comprising:
   a patterning subsystem for transferring a pattern to a substrate; and
   a measuring subsystem for measuring positions of said substrate in relation to the patterning subsystem,
wherein the patterning subsystem is arranged to use the positions measured by the measuring subsystem to apply said pattern at a desired position on the substrate and wherein the measuring subsystem is arranged to position the applied pattern by reference to a measured positions of at least one alignment target provided on the substrate and wherein the measuring subsystem is arranged to calculate said measured position of said at least one alignment target by a method according to any of clauses 13 to 22; and
wherein the inspection apparatus is operable to perform step (a) of said method.

38. A lithographic apparatus according to clause 37, further being operable to the method of manufacturing devices according to any of clauses 29 to 34.

39. A computer program product comprising machine-readable instructions for causing a processing device to perform the calculation of step (b) of the method according to any of clauses 1 to 34, to obtain a measured position of one or more alignment targets.

40. A computer program product according to clause 39, further comprising instructions for controlling a lithographic apparatus to apply a pattern to said substrate at a position defined by reference to the calculated position of the one or more alignment targets.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method comprising:
   measuring a sub-segmented target by illuminating the sub-segmented target with radiation and detecting radiation diffracted by the sub-segmented target using a detector system to obtain signals containing positional information of the sub-segmented target, the measuring performed on the sub-segmented target when the sub-segmented target is still in resist, the sub-segmented target comprising structures arranged periodically in at least a first direction, at least some of the structures comprising smaller sub-structures, and the sub-segmented target formed with a positional offset between the structures and the sub-structures that is a combination of both known and unknown components; and
   using the signals, together with information on the known component of the positional offset of the sub-segmented target, to calculate a measured position of an alignment target on a substrate which is corrected for the unknown component of the positional offset.

2. The method as claimed in claim 1, comprising determining a measure of asymmetry in the sub-segmented target and using this measure of asymmetry to correct for the unknown component of the positional offset when calculating the measured position of the alignment target.

3. The method as claimed in claim 1, wherein the signals containing position information include a set of signals that are obtained for the sub-segmented target, wherein each signal of the set is obtained using radiation having a different characteristic.

4. The method as claimed in claim 3, wherein the calculation of the measured position is based at least partly on an assumption that a relationship between the position information contained in a signal and the positional offset of a target has the same mathematical form for each signal of the set of signals.

5. The method as claimed in claim 3, wherein the radiation having different characteristics includes radiation having different wavelengths, polarizations and/or illumination profiles.

6. The method as claimed in claim 1, wherein the sub-segmented target comprises at least two segments having different known components of the positional offset between the structures forming the target and the sub-structures within the structures, the two or more segments formed in close proximity so as to form a composite target.

7. The method as claimed in claim 1, wherein the signals are further used to determine corrections for subsequent substrates, the corrections for reducing the magnitude of the unknown component of the positional offset in the subsequent substrates.

8. The method as claimed in claim 1, wherein the detecting is performed using an inspection apparatus configured for a measurement other than, or in addition to, an alignment measurement.

9. The method as claimed in claim 8, further comprising determining a correction for the calculation of a measured position of the alignment target, the calculation further using measurements of the alignment target performed during positioning of a substrate in a lithographic apparatus.

10. The method as claimed in claim 8, wherein the calculating a measured position of the alignment target comprises calculating a measured position of a target other than the sub-segmented target.

11. The method as claimed in claim 10, wherein the sub-segmented target comprises structural characteristics compatible with the inspection apparatus.

12. The method as claimed in claim 10, wherein the alignment target comprises a non-differential alignment target and the method further comprises performing a process calibration step to determine a sensitivity of the unknown component of the positional offset to overlaid structures having been formed overlaying the alignment target; and using the sensitivity to make a correction as part of the calculation of a measured position of the alignment target.

13. The method as claimed in claim 12, wherein the process calibration step comprises:
   forming a test sub-segmented alignment target on a test substrate;
   forming an overlaid structure, corresponding to the overlaid structures which will have been formed prior to the calculation of a measured position of the alignment target during production, overlaying the test sub-segmented alignment target on the substrate;
   performing a calibration measurement of the test sub-segmented alignment target; and
   determining the sensitivity from the calibration measurement.

14. A non-transitory computer program product comprising machine-readable instructions therein, the instructions, when executed by a processing device system, are configured to cause the processing device system to at least:
   obtain signals containing positional information of a sub-segmented target, the signals obtained by measurement of the sub-segmented target by illumination of the sub-segmented target with radiation and detection of radiation diffracted by the sub-segmented target using a detector system, the measurement performed on the sub-segmented target when the sub-segmented target is still in resist, the sub-segmented target comprising structures arranged periodically in at least a first direction, at least some of the structures comprising smaller sub-structures, and the sub-segmented target formed with a positional offset between the structures and the sub-structures that is a combination of both known and unknown components; and
   use the signals, together with information on the known component of the positional offset of the sub-segmented target, to calculate a measured position of an alignment target on a substrate which is corrected for the unknown component of the positional offset.

15. The product as claimed in claim 14, further comprising instructions configured to cause the processing device system to control a lithographic apparatus to apply a pattern to the substrate at a position defined by reference to the calculated position of the alignment target.

16. The method according to claim 1, wherein fewer sub-segmented targets are measured than there are alignment targets for which a corrected measured position is calculated, such that corrected measured positions of a plurality of the alignment targets are corrected using signals from a same sub-segmented target.

17. The method according to claim 1, wherein the detecting is performed using a lithographic apparatus.

18. A method of manufacturing devices, wherein a device pattern is applied to a substrate using a lithographic process, the method including positioning the applied pattern by reference to a measured position of an alignment target formed on the substrate, the measured position obtained by the method according to claim 1.

19. The method according to claim 18, comprising exposing a first layer comprising the sub-segmented target and the alignment target, either separately or as a single target.

20. A lithographic apparatus comprising:
   a patterning subsystem configured to transfer a pattern to a substrate; and
   a measuring subsystem configured to measure positions of the substrate in relation to the patterning subsystem,
   wherein the patterning subsystem is arranged to use the positions measured by the measuring subsystem to apply the pattern at a desired position on the substrate,
   wherein the measuring subsystem is arranged to position the applied pattern by reference to a measured position of an alignment target provided on the substrate, and wherein the measuring subsystem is arranged to calculate the measured position of the alignment target by the method according to claim 1.

* * * * *